United States Patent
Stowell et al.

(10) Patent No.: US 6,394,755 B1
(45) Date of Patent: May 28, 2002

(54) ENHANCED COATING SYSTEM FOR TURBINE AIRFOIL APPLICATIONS

(75) Inventors: William R. Stowell, Rising Sun, IN (US); Bangalore A. Nagaraj, West Chester; Ching-Pang Lee, Cincinnati, both of OH (US); John F. Ackerman, Laramie, WY (US); Rajasingh S. Israel, Westlake, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/489,716

(22) Filed: Jan. 24, 2000

(51) Int. Cl.[7] .................................................. F01D 5/14
(52) U.S. Cl. ............................... 416/241 R; 416/241 B
(58) Field of Search ........................ 416/241 R, 241 B; 428/623, 633, 632, 678, 680, 668

(56) References Cited

U.S. PATENT DOCUMENTS

| | | | |
|---|---|---|---|
| 4,916,022 A | * 4/1990 | Solfest et al. ................ | 428/623 |
| 5,015,502 A | * 5/1991 | Strangman et al. ........ | 427/248.1 |
| 5,180,285 A | * 1/1993 | Lau ........................ | 416/241 B |
| 5,238,752 A | * 8/1993 | Duderstadt et al. ......... | 428/623 |
| 5,763,107 A | 6/1998 | Rickerby et al. ............ | 428/623 |
| 5,891,267 A | 4/1999 | Schaeffer et al. ........... | 148/206 |
| 5,952,085 A | 9/1999 | Rickerby et al. ........... | 428/216 |

* cited by examiner

Primary Examiner—Edward K. Look
Assistant Examiner—Ninh Nguyen
(74) Attorney, Agent, or Firm—David L. Narciso; Carmen Santa Maria

(57) ABSTRACT

A tightly adherent anti-stick coating applied over coated turbine components of gas turbine engines. The tightly adherent coating is an oxide of at least one metal selected from the group consisting of Pt, W, group 4b and group 5b metals of the periodic table and Si, Ge and Sn of group 4a. The oxide is applied directly over existing environmental coatings, and thermal barrier coatings. It can also be applied directly to substrate material and to areas that are not within the combustion exhaust gases, such as platform portions and shank portions of airfoils including turbine blades. The oxide is conveniently applied to a uniform thickness of no greater than about 10 microns, and prevents the build-up of corrosion products and other products of combustion from the gases, thereby increasing the life expectancy of the component.

17 Claims, 2 Drawing Sheets

ENHANCED COATING SYSTEM FOR TURBINE AIRFOIL APPLICATIONS

BACKGROUND OF THE INVENTION

1. Field of the Invention

This invention is related to environmental and thermal barrier coating systems exposed to high temperatures such as the hostile thermal environment of a gas turbine engine. More particularly, the present invention is directed to a layer applied over the environmental layer or the thermal barrier layer of an airfoil that reduces the build-up of corrosive materials on the outer surface of the airfoil.

2. Discussion of the Prior Art

Many coating systems have been developed that improve the life of turbine airfoil components. Typically these components are made from high temperature superalloy materials and have an airfoil portion, a platform portion and a shank portion. These systems typically include an environmental coating applied over the airfoil portion of the superalloy substrate that extends into the hot gases of combustion to provide protection to the substrate from oxidation and corrosion typically experienced in this high temperature exhaust gas. In many cases, a ceramic thermal barrier coating is applied over the environmental coating to improve the high temperature response of the system. These coatings have been refined over time and new coatings have been developed for specific applications.

Early coatings for gas turbine applications included nickel aluminide coatings applied by a codeposition (Codep) process. As refinements to the coatings and processing have occurred, the preferred coating for protection against oxidation and hot corrosion that has evolved is a nickel-platinum aluminide application in which a layer of platinum is deposited over the substrate followed by an aluminizing application. The aluminide may be applied by a Codep process or by a vapor phase aluminide process. The resulting coating is a graded composition of (Ni,Pt)Al. For marine applications in which salt water environments present a problem due to the severe corrosion experienced, the MCrAlY class of coatings were developed, where M is an element selected from the group consisting of Ni, Co, Fe and combinations thereof.

As the oxidation and corrosion issues of the airfoil portion of the component were addressed by the coatings, corrosion problems in the platform portion and below the platform portion in the shank portion developed due to other improvements in turbine operation that has permitted an increase in the operating temperature of the engine and hence in the temperature of the exhaust gases. In order to address this problem, the (Ni,Pt)Al coating has been applied to the platform portion and the shank portion of the components. However, for a number of reasons, including but not limited to rubbing associated with rotating apparatus, the coating has not been fully effective in providing protection against corrosion in these regions. Despite improvements in coating compositions and processing technology, a build-up of corrosion as a result of interactions with hot combustion gases occurs in these regions. Corrosion as used herein includes oxidation as well as interactions of the substrate with other hot gases.

Various modifications to coating systems to improve coating performance have been proposed. These can include additional layers over the substrate. For example, U.S. Pat. No. 5,891,267 forms a carburized zone below an alumina layer in order to tie up refractory metals present in the underlying superalloy substrate to that these elements will not migrate to detrimentally affect he bond coat-oxide layer interface and accelerate corrosion of the substrate. Another example is set forth in U.S. Pat. No. 5,952,085 to Rickerby, et al. in which multiple erosion resistant coatings are applied over substrates by spattering to improve erosion resistance. These alternating layers are comprised of tungsten (W) and titanium diboride. The alternating layers are between 0.3–1 micron thick. Yet another example is set forth in U.S. Pat. No. 5,763,107 also to Rickerby, et al. This patent sets forth a variation of the (Ni—Pt)Al bond coat in which the outer portion of the bond coat is a continuous layer of a platinum-group aluminide and the inner portion of the bond coat is substantially an aluminum-containing alloy. The continuous layer of platinum-group aluminide is covered with an adherent oxide layer of alumina. Overlying this is the ceramic thermal barrier insulating coat. While this coating may provide initial advantages, after exposure at elevated temperatures for extended periods of time, diffusion of elements should make this composition indistinguishable from conventional (Ni,Pt)Al coatings and thus subject to the problems experienced and described previously.

What is needed is a coating that can be used on turbine components that is effective in reducing the build-up of corrosive materials on all portions of the component and that can enhance the environmental protection of currently applied bond coatings and environmental coatings.

SUMMARY OF THE INVENTION

The present invention is generally applicable to components that operate in high temperature environments in which there is exposure to hot gases of combustion that can cause corrosion of the components, including oxidation such as are found in gas turbine engines. Improvements in manufacturing technology and materials are the keys to increased performance and reduced costs for many articles including those used in gas turbine engines. As an example, continuing and often interrelated improvements in processes and materials have resulted in major increases in the performance of aircraft gas turbine engines that result in even higher operating temperatures for these engines. As the operating temperatures increase, the effects of the high temperature environment are observed in regions beyond the portions extending immediately into the hot stream of gases, previously the airfoil portions of blades and vanes. Over time, these conditions ultimately can cause the deterioration of even the protective coatings applied to substrates to improve their performance. The hot gases of combustion may additionally deposit products of combustion onto surfaces of the components that may contribute to the corrosion of the component. Notable examples of such components include airfoils such as turbine blades or buckets and turbine vanes. The present invention is not limited to airfoils as other components that can benefit from the present invention include combustors, combustor liners and turbine shrouds.

Generally, the present invention is a tightly adherent coating that provides a surface that is described as anti-stick in that products of combustion and other deposits that may be present in hot gases of combustion to not deposit on it. This tightly adherent coating is applied over the component and assists the component operating at high temperatures by increasing its life expectancy. The coating can provide additional protection to the underlying component even at the elevated temperatures and extreme environments found in the portion of the turbine engine aft of the combustor. While not impervious to diffusion of oxygen, the coating does act to slow the diffusion of oxygen to the underlying coatings, thereby extending the life of these coatings by slowing the inevitable process of deterioration. Substrate articles designed to survive in this environment are comprised of superalloys having the required mechanical properties that are especially engineered and designed to be able to withstand the harsh environments and high temperatures. In order to improve the life of these alloys, coatings are applied over the superalloy substrate. The coating of the present invention can be applied directly over these tightly adherent coatings to delay their deterioration over time and increase their life expectancy.

The tightly adherent coating that overlies the substrate component is a thin, tightly adherent oxide layer formed by the oxidation of at least one metal from groups 4b or 5b, certain elements of group 4a of the Periodic Table of elements, platinum (Pt) and tungsten (W) or combinations of these metals. By proper application of these metallic oxides, the outer surface of the component exposed to the extreme environment is less resistant to accumulation of deposits resulting from exposure to the combustion gases, while diffusion of oxygen to the underlying surfaces is slowed. Because the turbine components of the present invention have reduced build-up of deposits that typically include corrosive chemicals and the diffusion of oxygen to underlying materials is reduced, the underlying component can operate for longer periods of time before requiring refurbishment or repair.

An advantage of the present invention is that the antistick coating in not only hard, durable and capable of withstanding high temperatures, but it also very light. Thus, the longer life of the components can be achieved with no weight penalties with the present invention. The very thin coating allows for its use on components have cooling channels and other openings without concern about blocking important cooling openings so that special precautions or preparation is not required for its application. The minimal thickness of the coating also has a minimal effect on the dimensioning and tolerancing of the parts to which it is applied.

Another advantage of the present invention is that it is compatible with the materials utilized in the turbine portions of gas turbine engines. These materials include the specially engineered superalloys as well as the environmental coatings and bond coatings typically applied to these superalloys to extend their life and to the ceramic thermal barrier coatings applied over these coatings to improve the thermal performance of these components.

Yet another advantage of the coating of the present invention is that it is inexpensive in comparison to the cost of coatings including MCrAlY coatings and platinum aluminide coatings. And although the coatings of the present invention are not designed to replace such coatings in the airfoil portions of components, they can extend the life of such coatings thereby reducing overall operating costs. Because the coatings of the present invention minimize the deterioration of the expensive MCrAlY coatings and platinum aluminide coatings, refurbishment of these coatings may be accomplished at reduced costs without the need for complete removal.

Other features and advantages of the present invention will be apparent from the following more detailed description of the preferred embodiment, taken in conjunction with the accompanying drawings which illustrate, by way of example, the principles of the invention.

Whenever possible, the same reference numbers will be used throughout the figures to refer to the same parts.

DETAILED DESCRIPTION OF THE INVENTION

A tightly adherent coating applied over a superalloy turbine component exposed to hot gases of combustion improves the ability of the superalloy component to resist the accumulation of deposits such as products of combustion. The ability of the superalloy component to resist the accumulation of deposits on its surface is an indication of the anti-stick characteristics of the surface. As used herein, a coating applied to a component that improves the anti-stick characteristics of the surface of the component is referred to as an anti-stick coating.

Figure 1:
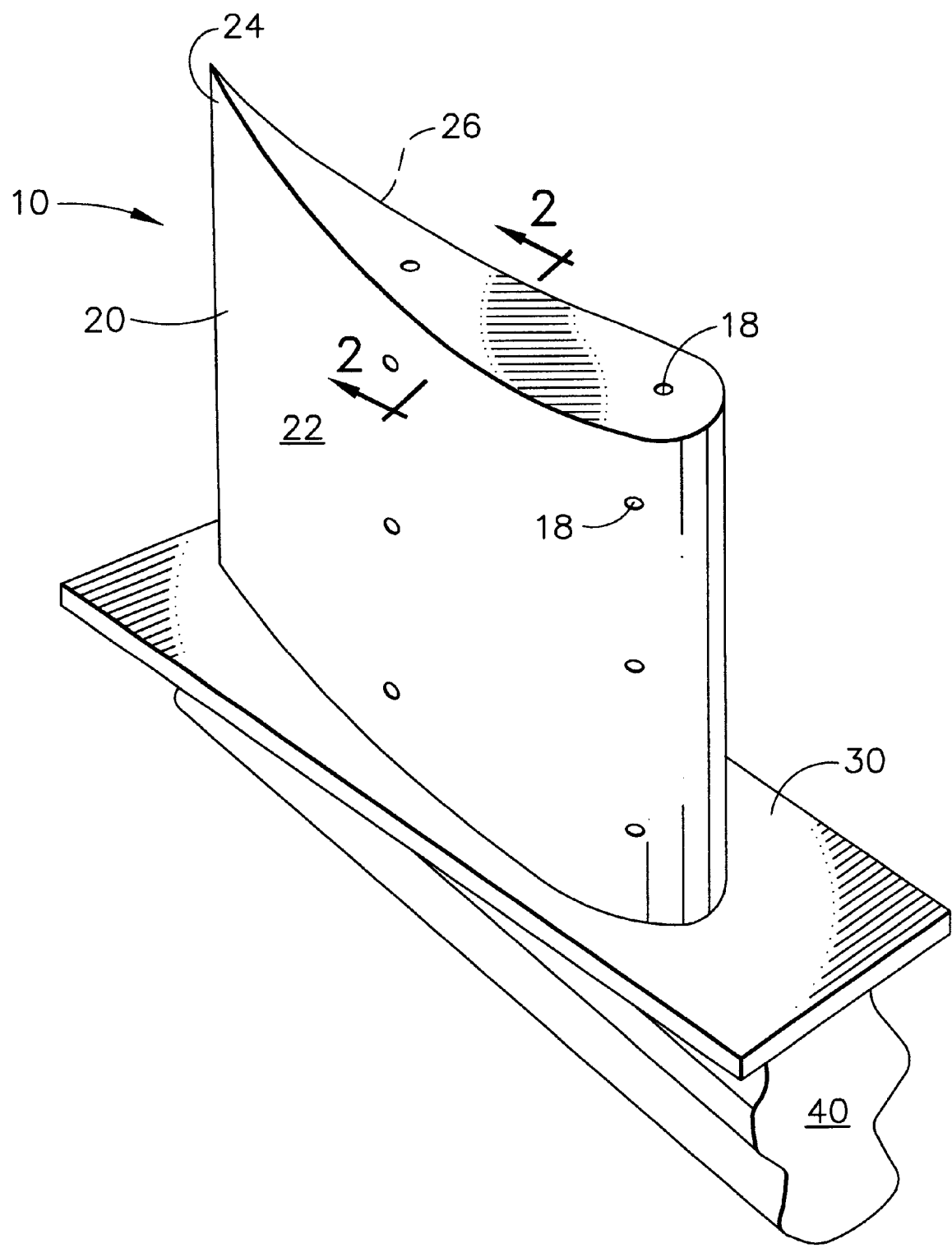
FIG. 1 is a perspective view of a prior art turbine blade.

The present invention thus comprises a substrate article formed of a high temperature alloy engineered to withstand high temperatures and accompanying corrosive environments. Typically, these high temperature alloys are superalloys such as the Rene series, Rene 80, Rene N4, Rene N5 and Rene N6, MAR-M-509, IN-718, UDIMET 720, L605 and IN-738. For example, MAR-M-509 has a nominal composition by weight of 10% Ni, 0.6% C, 0.1% Mn, 0.4% Si, 22.5% Cr, 1.5% Fe, 0.01% B, 0.5% Zr, 7% W, 3.5% Ta and the balance Co and incidental impurities; L605 has a nominal composition by weight of 20% Cr, 10% Ni, 15% W, 3% Fe, 1%, Si, 1.5% Mn, 0.1% C, and the balance Ni and incidental impurities; Rene N5, has a nominal composition by weight of 7.5% Co, 7% Cr, 6.2% Al, 6.5% Ta, 5% W, 3% Re, 1.5% Mo, 0.15% Hf, 0.05% C, 0.004% B and the balance Ni and incidental impurities; and IN-738 has a nominal composition by weight of 8.5% Co, 16% Cr, 3.4% Al, 3.8% Ti, 1.75% Ta, 2.6% W, 1.75% Ta, 0.012% B, 0.12% Zr, 0.05% Cb and the balance Ni and incidental impurities. These alloys are provided as examples and are not meant to include all superalloys FIG. 1 is a perspective view of a typical superalloy airfoil component, a turbine blade 10. The superalloy blade substrate is comprised of an airfoil portion 20 that extends outward into the hot gases of combustion found in aircraft exhaust, a platform portion 30 and a dovetail or shank portion 40. Turbine blades 10 including cooling holes 18 typically have an environmental coating 22 such as an MCrAlY or an aluminide applied over the airfoil portion 20. Usually, the tip 24 of the airfoil portion 20 includes a columnar-grained ceramic thermal barrier coating 26, such as YSZ, overlying the environmental coating 22 that also serves as a bond coating. The coatings 22, 26 overlying the airfoil substrate portion 20 in the vicinity of the tip are shown in cross section in FIG. 2, and are typical of coatings, when present, overlying substrates. There are circumstances in which an environmental coating 22 is extended downward over platform portion 30, and even partially or fully downward over shank portion 40.

The portion of the article exposed to the hot gases of combustion found aft of the combustor portion of the gas turbine engine typically are coated with an environmental coating 22 to protect the substrate from the corrosive and oxidative effects of the hot gases. Most typically, these coatings 22 are tightly adherent. These coatings 22 usually are classified as aluminides or MCrAlYs and are applied to the airfoil portion 20 of turbine blades and vanes, and to the surfaces of liners exposed to hot turbine gases. Aluminides are intermetallic compounds formed on the surface of the substrate by a number of different available processes including but not limited to diffusion methods. Aluminides are selected from the group consisting of nickel aluminides, platinum aluminides and combinations thereof. MCrAlY coatings are deposited on the surface of the substrate where M is at least one element selected from the group consisting of nickel, cobalt and iron. As the temperature of the exhaust gases has increased, the coatings have been extended to portions of components such as the platform portion of blades 30 and the shank portion of blades 40 not directly in the flow of the hot gases of combustion that heretofore had not experienced problems with oxidation and hot corrosion.

In applications where thermal performance is important, ceramic thermal barriers are grown over the environmental coating 22. These ceramic thermal barrier coatings 26 are typically made from yttrium-stabilized zirconia (YSZ).

The present invention can be applied directly over these pre-coated surfaces to improve their performance in environments in which oxidation and corrosion are a problem. The anti-stick coating of the present invention is a thin, tightly adherent metallic oxide formed by an oxide of at least one metal selected from group 4b and 5b and several of the elements of group 4a of the Periodic Table as well as Pt and W. These elements include from group 5b, tantalum (Ta), niobium (columbium) (Nb), vanadium (V), from group 4b, hafnium (Hf), zirconium (Zr), titanium (Ti), and group 4a, germanium (Ge), silicon (Si) and tin (Sn). The metallic oxide can be formed directly over the surfaces of the superalloy substrate component. To be considered for use in a particular application, the metallic oxide must be stable at the maximum temperatures experienced in the application. The anti-stick coating is deposited directly onto the outer surface of the component in the gas flowpath which usually already includes environmental coatings 22 and onto portions of components that are not in the direct flowpath of hot gases of combustion, such as the shank portion 40 and the platform portion 30 of turbine airfoils 10. These environmental coatings 22 include platinum aluminides, nickel aluminides, combinations of these, (Ni,Pt)Al coatings and MCrAlY coatings. Uniquely, the anti-stick coatings 28 of the present invention can be applied directly over ceramic thermal barrier coatings 26 (TBCs) when these TBCs form the outer surface of the component. The application of the anti-stick coating 28 reduces the build-up of corrosive materials that would otherwise adhere to the outer surface of the component. These corrosive materials can include hot products of combustion that contain a variety of detrimental elements including but not limited to elements such as sulfur and phosphorus. The anti-stick coating, by reducing or eliminating the presence of these products, minimizes or eliminates their ability to attack the underlying coating and substrate. The anti-stick coating 28 also provides an additional benefit as a barrier to oxygen. Although the anti-stick coating is not impervious to oxygen, it does shield the underlying coating and substrate from direct contact with gases that oxidize these surfaces. Although oxidation will still occur, the rate of the oxidation reaction is slowed since diffusion through the anti-stick layer reduces the flow of available oxygen.

The tightly adherent anti-stick layer that is a metallic oxide formed from at least one metal selected from group 4b and 5b, Si, Ge, or Sn of group 4a and W or Pt provides virtually no weight penalty to the turbine components to which it is applied, as it is very thin. The metallic oxide is applied in thicknesses of no greater than 10 microns. If the anti-stick layer is applied in thicknesses greater than 10 microns, it has a tendency to spall from the surface as hot gases pass over it at high velocities and elevated temperatures. This critical thickness of the layer thus is important to its ability to tightly adhere to the substrate. And of course, a thin coating is desirable because of on-going concerns with weight. In a preferred embodiment, the thickness of the coating is not greater than about 5 microns, and most preferably is from about 0.5–2 microns in thickness. The coating can be applied by any method that achieves a uniform, tightly adherent coating of the desired thickness.

Figure 2:
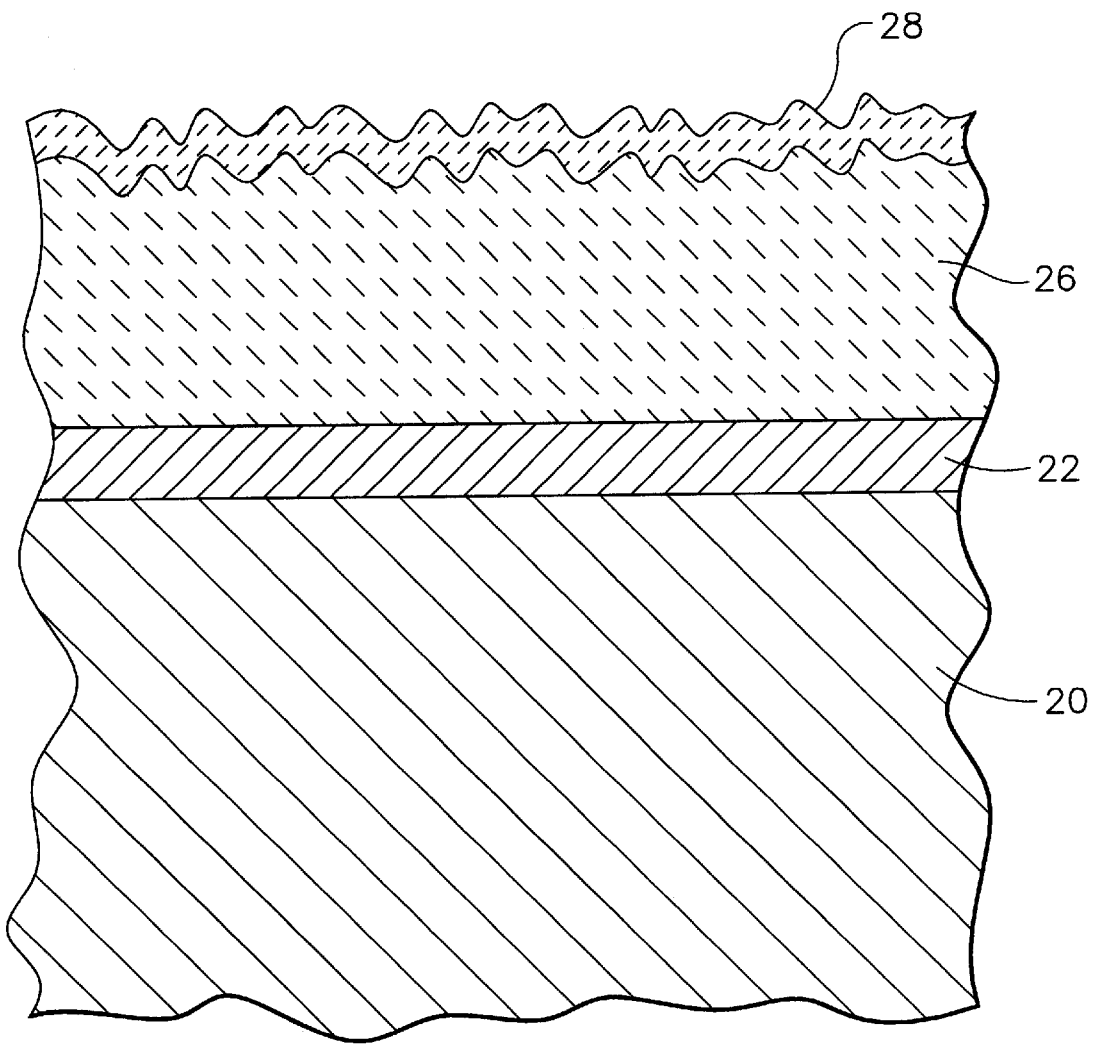
FIG. 2 is a cross-section of the prior art turbine blade of FIG. 1 along lines 2—2 that includes the coating of the present invention.

In the best mode of practicing the invention, and again referring to FIGS. 1 and 2, turbine airfoils 10 that included environmental/bond coatings 22 applied over the airfoil portion 20, at least a part of the shank portion 40 and the platform portion 30, and that additionally included a YSZ thermal barrier coating 26 applied over the tip 24 of airfoil portion 20 was prepared for coating with the anti-stick layer of the present invention by cleaning the airfoils with a suitable solvent to remove loose dirt, grease, oils and other foreign materials. Any suitable well-known solvent can be used to accomplish the task, as the presence of these materials can interfere with the adherence and continuity of the coating. While it was not necessary to mask openings such as cooling holes 18 in the airfoils 10, masking may be performed if minute holes exist in the airfoil and there is concern about these openings becoming blocked. The airfoils were then placed in a CVD coater. The CVD coater was capable of handling a plurality of blades, however, if desired, the blades may be coated individually in the CVD coater. The CVD chamber was then purged of oxygen by introduction of an inert gas or nitrogen. The temperature of the chamber was increased to a temperature in the range of 720–900° F. (382–482° C.). The temperature selected will vary depending upon the coating to be applied and will be above about 500° F. (260° C.). Once the temperature was achieved, a carrier gas that was a mixture of a precursor gas that included the precursor material and an inert gas or nitrogen was introduced. Usually, the carrier gas is a mixture of the precursor gas and the same gas used for purging the chamber. For these airfoils, the precursor gas was tantalum ethoxide having a partial pressure of about 50–500 microinches or mercury. The flow of gases was continued for a time sufficient to achieve a coating 28 of the desired thickness. This time can be calculated with very good accuracy. The flow of gas was maintained until a thickness of tantalum oxide of 0.5–1 micron was achieved. The time for such a thickness at these above temperatures is from 1–3 hours. Thicker coatings naturally will require higher temperatures or longer times or both. Once the desired thickness of coating was achieved, the flow of gas into the CVD chamber was stopped, the temperature in the chamber was reduced and the airfoils are removed from the chamber. FIG. 2 shows the anti-stick coating 28 of the present invention overlying only the ceramic topcoat 26 in cross-section. However, the coating of the present invention is applied to all portions of the component that are not masked to prevent its application.

Testing was performed on substrates of Rene 80, INCO 718 and UDIMET 720. The substrates were standard plate samples otherwise prepared as a standard airfoil component. However, one set of substrates was treated by depositing an anti-stick coating of tantalum oxide over the substrates to a thickness of 1 micron using parameters noted above. Hot corrosion tests were performed at 1700° F. (927° C.) in an environment of calcium sulfate in accordance with established test procedures. Failure of the substrates is determined by the amount of time required for corrosion to penetrate a predetermined amount, about 0.001", into the substrate. The amount of time for the corrosion to penetrate to this depth took ten times longer for the substrates coated with tantalum oxide in accordance with the present invention than for substrates not having a coating of the present invention. Thus, the corrosion resistance of the substrates that were coated with the anti-stick coating of the present invention had an expected life that was 10 times longer than substrates not having an anti-stick coating.

Although the present invention has been described in connection with specific examples and embodiments, those skilled in the art will recognize that the present invention is capable of other variations and modifications within its scope. These examples and embodiments are intended as typical of, rather than in any way limiting on, the scope of the present invention as presented in the appended claims.

What is claimed is:

1. A coated superalloy component for use in an atmosphere of hot, corrosive gases, comprising:
   a substrate article formed of a superalloy;
   a tightly adherent environmentally resistant coating applied over the superalloy substrate; and
   a thin, tightly adherent anti-stick coating applied over the environmentally resistant coating, the anti-stick coating being a metallic oxide consisting of a metal selected from the group consisting of Pt, W, Si, Ge, Sn and group 5b of the periodic table.

2. The superalloy component of claim 1 wherein the tightly adherent environmentally resistant coating is an aluminide coating selected from the group consisting of nickel aluminide, platinum aluminide and combinations thereof.

3. The superalloy component of claim 1 wherein the tightly environmentally resistant coating is a MCrAlY coating wherein M is an element selected from the group consisting of nickel, cobalt and iron and combinations thereof.

4. The superalloy component of claim 1 wherein the tightly adherent anti-stick coating is a thin oxide layer applied to reduce the adherence of deposits from the hot, corrosive atmosphere and to reduce the exposure of the environmentally resistant layer to oxygen.

5. The superalloy component of claim 4 wherein the tightly adherent anti-stick coating is tantalum oxide.

6. A coated superalloy component comprising:
   a substrate article formed of a superalloy;
   a tightly adherent bond coating applied over the superalloy substrate;
   a thermal barrier coating of stabilized zirconia applied over the bond coating; and
   a tightly adherent anti-stick coating applied over the thermal barrier coating.

7. The coated superalloy component of claim 6 wherein the bond coat is a MCrAlY coating wherein M is an element selected from the group consisting of nickel, cobalt and iron and combinations thereof.

8. The coated superalloy component of claim 6 wherein the thermal barrier coating is yttrium-stabilized zirconia.

9. The coated superalloy 6 wherein the tightly adherent anti-stick layer is a metallic oxide consisting of at least one metal selected from the group consisting of Pt, W, Si, Ge, Sn and groups 4b and 5b of the periodic table and combinations thereof.

10. The superalloy component of claim 9 wherein the metallic oxide is tantalum oxide.

11. A tightly adherent, high temperature, thin anti-stick coating applied over the outer surface of a turbine airfoil comprising a metallic oxide consisting essentially of at least one metal selected from the group consisting of Pt, W, Si, Ge, Sn and groups 4b and 5b of the periodic table and combinations thereof applied to a thickness of no greater than about 10 microns.

12. The anti-stick coating of claim 11 wherein the metallic oxide is tantalum oxide.

13. The anti-stick coating or claim 11 wherein the coating is applied to a thickness in the range of 0.5–2 microns.

14. A superalloy turbine airfoil comprising:
   a blade portion, a shank portion and a platform portion intermediate between the blade portion and the shank portion, each formed of a superalloy;
   a tightly adherent environmentally resistant coating applied over at least the blade portion; and
   a tightly adherent, high temperature, thin anti-stick coating applied to the platform portion of the airfoil and over at least a part of the shank portion of the airfoil.

15. The airfoil of claim 14 wherein the tightly adherent environmentally resistant coating is applied over the blade portion, the platform portion and at least a part of the shank portion, and a tightly adherent anti-stick portion applied over the blade portion, the platform portion and at least a part of the shank portion of the airfoil.

16. A superalloy turbine airfoil comprising:
   a blade portion, a shank portion and a platform portion intermediate between the blade portion and the shank portion, each formed of a superalloy;
   a tightly adherent bond coating applied over at least the blade portion;
   a thermal barrier coating applied over the bond coating on the blade portion; and
   a tightly adherent, high temperature, thin anti-stick coating applied under the platform portion of the airfoil and over at least a part of the shank portion of the airfoil.

17. The airfoil of claim 16 wherein the tightly adherent bond coating is applied over the blade portion, the platform portion and at least a part of the shank portion, and a tightly adherent anti-stick portion applied over at the shank portion of the airfoil.

* * * * *